(12) United States Patent
Sharma et al.

(10) Patent No.: US 10,001,421 B2
(45) Date of Patent: Jun. 19, 2018

(54) METHOD FOR FABRICATING A PRESSURE SENSOR

(71) Applicants: BOARD OF REGENTS, THE UNIVERSITY OF TEXAS SYSTEM, Austin, TX (US); Tushar Sharma, Austin, TX (US); Xiaojing Zhang, Austin, TX (US)

(72) Inventors: Tushar Sharma, Austin, TX (US); Xiaojing Zhang, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days. days.

(21) Appl. No.: 15/030,301

(22) PCT Filed: Oct. 24, 2014

(86) PCT No.: PCT/US2014/062241
§ 371 (c)(1),
(2) Date: Apr. 18, 2016

(87) PCT Pub. No.: WO2015/061726
PCT Pub. Date: Apr. 30, 2015

(65) Prior Publication Data
US 2016/0238467 A1    Aug. 18, 2016

Related U.S. Application Data

(60) Provisional application No. 61/895,812, filed on Oct. 25, 2013.

(51) Int. Cl.
*G01L 1/16* (2006.01)
*H01L 41/087* (2006.01)
(Continued)

(52) U.S. Cl.
CPC .............. *G01L 1/16* (2013.01); *G01L 9/008* (2013.01); *H01L 41/087* (2013.01);
(Continued)

(58) Field of Classification Search
CPC ... H01L 41/087; H01L 41/082; H01L 41/113; H01L 41/332; H01L 41/314;
(Continued)

(56) References Cited

U.S. PATENT DOCUMENTS 3,938,502 A * 2/1976 Bom .................. A61B 8/12
600/463
3,971,250 A * 7/1976 Taylor ................ G01D 3/028
307/400

(Continued)

OTHER PUBLICATIONS

Egusa et al. "Multimaterial piezoelectric fibres" Nature Materials, vol. 9, Aug. 2010. DOI: 10.1038/NMAT2792.*
(Continued)

*Primary Examiner* — Jonathan Dunlap
(74) *Attorney, Agent, or Firm* — Russell Ng PLLC; Antony P. Ng

(57) ABSTRACT

A method of fabricating a pressure sensor is disclosed. Initially, a first metal is deposited on top of a substrate, and the first metal is patterned accordingly. A PVDF-TrFE nano fiber is then deposited on top of the first metal layer, and the PVDF-TrFE nano fiber is etched. A second metal layer is subsequently deposited on top of the PVDF-TrFE nano fiber, and the second metal layer is etched to form a pressure sensor.

14 Claims, 2 Drawing Sheets

(51) Int. Cl.
    *H01L 41/113* (2006.01)
    *H01L 41/22* (2013.01)
    *G01L 9/00* (2006.01)
    *H01L 41/193* (2006.01)
    *H01L 41/29* (2013.01)
    *H01L 41/314* (2013.01)
    *H01L 41/332* (2013.01)
    *G01L 9/08* (2006.01)

(52) U.S. Cl.
    CPC ........ *H01L 41/1132* (2013.01); *H01L 41/193* (2013.01); *H01L 41/22* (2013.01); *H01L 41/29* (2013.01); *H01L 41/314* (2013.01); *H01L 41/332* (2013.01); *G01L 9/08* (2013.01)

(58) Field of Classification Search
    CPC ....... H01L 41/193; H01L 41/29; H01L 41/22; H01L 41/1132; Y10T 29/42; Y10T 428/139; Y10T 442/612; G01L 1/16; G01L 9/008; G01L 9/08
    USPC ...... 73/774, 717, 777, 862.68; 310/800, 338
    See application file for complete search history.

(56) References Cited

U.S. PATENT DOCUMENTS

| | | | | |
|---|---|---|---|---|
| 4,191,193 A * | 3/1980 | Seo | ..................... | A61B 5/0215 252/62.9 R |
| 7,047,800 B2 * | 5/2006 | Thiesen | .............. | B60C 23/0411 73/146 |
| 7,467,558 B2 * | 12/2008 | Fukuda | .................... | G01L 1/16 73/777 |
| 9,059,397 B2 * | 6/2015 | Park | .................... | H01L 41/1136 |
| 9,243,346 B2 * | 1/2016 | Pham | .................. | D01D 5/0069 |
| 2005/0274176 A1 * | 12/2005 | Thiesen | .............. | B60C 23/0411 73/146 |
| 2009/0220818 A1 * | 9/2009 | Asanuma | ................ | H01L 41/37 428/633 |
| 2011/0275947 A1 * | 11/2011 | Feldman | .............. | A61N 1/0563 600/508 |
| 2012/0137783 A1 * | 6/2012 | Wang | .................... | B82Y 30/00 73/717 |
| 2012/0306319 A1 * | 12/2012 | Park | ..................... | H01L 41/316 310/339 |
| 2013/0137207 A1 * | 5/2013 | Suminto | ............. | B81C 1/00158 438/53 |
| 2015/0275401 A1 * | 10/2015 | Wong | .................. | D01D 5/0069 442/338 |
| 2016/0054185 A1 * | 2/2016 | Servati | ................. | G01L 1/2287 73/774 |

OTHER PUBLICATIONS

Martinez et al. "Fabrication of Poly(vinylidene fluoride-trifluoroethylene) / Poly(3,4-ethylenedioxythiophene)-Polystyrene Sulfonate Composite Nanofibers via Electrospinning" Macromolecules, Sep. 4, 2009, vol. 42, 7924-7929. DOI: 10.1021/ma901365c.*

* cited by examiner

TO READOUT CIRCUIT

METHOD FOR FABRICATING A PRESSURE SENSOR

PRIORITY CLAIM

The present application claims priority under 35 U.S.C. § 119(e)(1) to provisional application No. 61/895,812 filed on Oct. 25, 2013, the contents of which are incorporated herein by reference.

BACKGROUND OF THE INVENTION

1. Technical Field

The present invention relates to pressure sensors in general, and in particular to a method for fabricating a PVDF-TrFE based pressure sensor.

2. Description of Related Art

Several types of microfabricated pressure sensors have been developed over the past decade. Based on their operating principles, these microfabricated pressure sensors can generally be grouped under three major categories, namely, capacitive sensors, piezoresistive sensors, and piezoelectric sensors.

Because of their simplicity and relatively low fabrication cost, capacitive sensors are commonly found in medical devices. Other advantages of capacitive sensors include low power consumption, high sensitivity and high scalability for miniaturization. But capacitive sensors can only handle relatively low pressures and require complex readout circuitry.

Piezoresistive sensors offer great mechanical stability but they have some drawbacks such as high power requirement, large temperature dependence offset, non-linearity, and long-term stability in dynamic field conditions.

The present disclosure is related to improved piezoelectric sensors that have a relative high dynamic pressure ranges.

SUMMARY OF THE INVENTION

In accordance with a preferred embodiment of the present invention, a first metal is deposited on top of a substrate, and the first metal is patterned accordingly. A PVDF-TrFE nano fiber is then deposited on top of the first metal layer, and the PVDF-TrFE nano fiber is etched. A second metal layer is subsequently deposited on top of the PVDF-TrFE nano fiber, and the second metal layer is etched to form a pressure sensor.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Piezoelectric polyvinyledendifluoride-tetraflurorethylene (PVDF-TrFE) is a semicrystalline polymer that has four phases, namely, α, β, γ and δ. Among the four phases, β phase is the most essential phase for pressure sensor implementation because β phase has the largest effective dipole moment. The key to achieving high piezoelectricity of the PVDF-TrFE polymer is the formation of β-crystalline phase that can significantly improve sensor performance. However, untreated PVDF-TrFE itself does not have a β phase without delicate mechanical stretching and electrical poling processes. Additionally, due to its infeasibility with the standard lithography process, many alternative fabrication methods, such as screen printing and shadow mask process, have been developed, but overall they are not compatible with the standard lithography process designed for sensor fabrication.

Figure 1A:
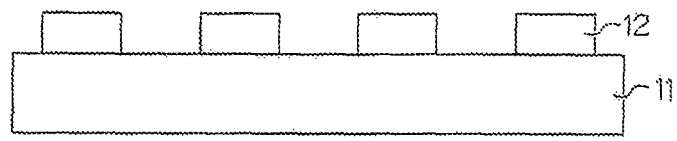
FIGS. 1a-e are process flow diagrams of a method for fabricating a PVDF-TrFE based pressure sensor, in accordance with a preferred embodiment of the present invention.
Figure 1B:
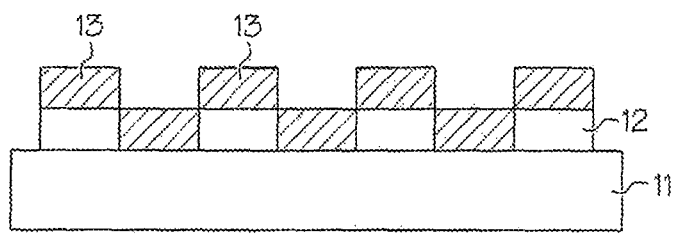
Figure 1C:
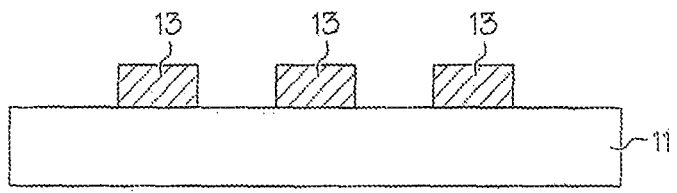

Referring now to the drawings and in particular to FIGS. 1a-e, there are illustrated process flow diagrams of a method for fabricating a PVDF-TrFE based pressure sensor, in accordance with a preferred embodiment of the present invention. Starting with a wafer 11, a photoresist layer 12 is deposited on top of wafer 11, and photoresist layer 12 is patterned to define the positions of a bottom layer of an electrode, as shown in FIG. 1A. Wafer 11 may have a double silicon-on-insulator (SOI) or kapton as substrate. A first metal layer 13 is then deposited on top of photoresist layer 12 and silicon wafer 11, as depicted in FIG. 1B. First metal layer 13 can be deposited on top of the substrate of wafer 11, making contact with first metal layer 13. First metal layer 13 is preferably an aluminum layer of approximately 2,000 Å thick. A lift-off process is subsequently utilized to remove photoresist layer 12 along with the unwanted portion of first metal layer 13, leaving the wanted portion of first metal layer 13, as shown in FIG. 1C.

Figure 1D:
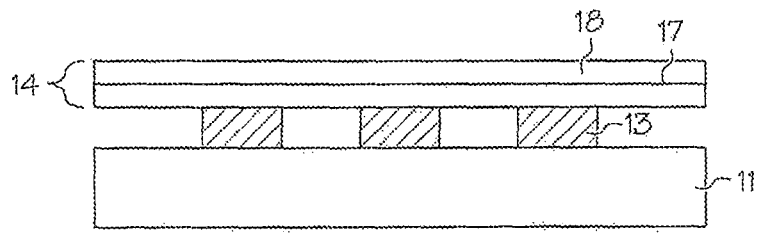

Next, a PVDF-TrFE (or PVDF) fiber 14 is then deposited on top of first metal layer 13, as depicted in FIG. 1D. Preferably, PVDF-TrFE fiber 14 includes a PEDOT core 17 surrounded by a PVDF-TrFE shell 18. PVDF-TrFE fiber 14 can be deposited on first metal layer 13 via an electrospin process. PVDF-TrFE fiber 14 is then etched. Preferably, a shadow mask can be utilized to pattern PVDF-TrFE fiber 14 in order to perform a reactive ion etch (RIE). The RIE may be performed under 100 sccm oxygen gas environment with 200 W RF power and 5 mT pressure. The rate of RIE is 150 nm/min. The photoresist mask can be etched simultaneously with an etch rate of 100 nm/min and the RIE is continued until the photoresist mask is etched fully.

Figure 1E:
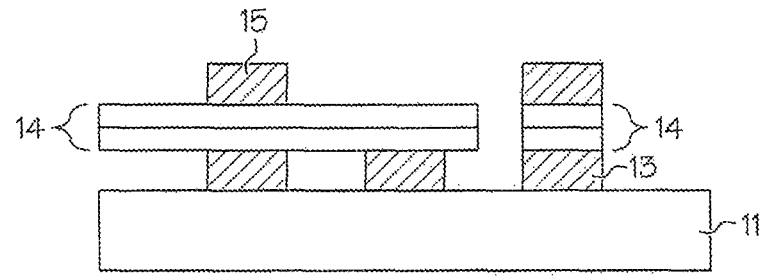

A second metal layer 15 is then deposited on top of PVDF-TrFE layer 14. Second metal layer 15 is subsequently etched. Preferably, a shadow mask can be utilized to pattern second metal layer 15 in order to perform a RIE. The RIE may be performed under 100 sccm oxygen gas environment with 200 W RF power and 5 mT pressure. The rate of RIE is 150 nm/min. The photoresist mask can be etched simultaneously with an etch rate of 100 nm/min and the RIE is continued until the photoresist mask is etched fully. The remaining structure, as shown in FIG. 1E, can be utilized as a pressure sensor.

Figure 2:
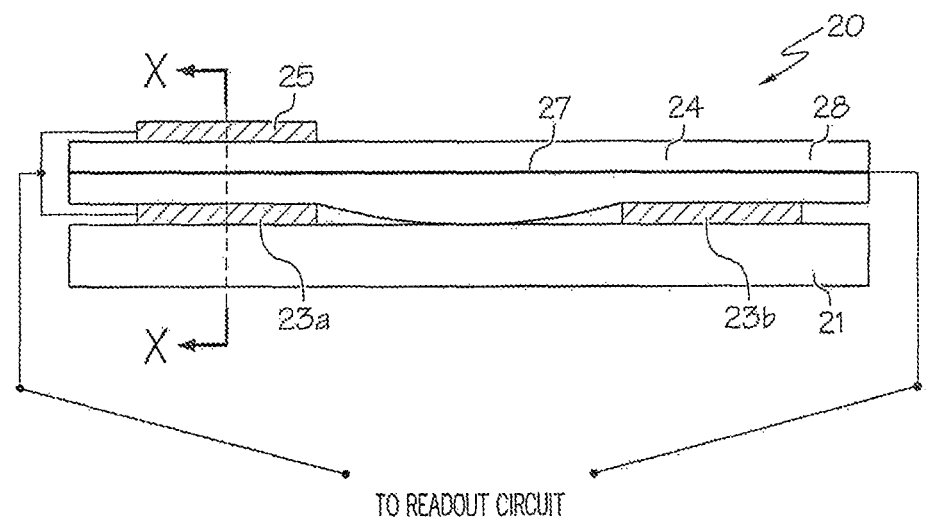
FIG. 2 is a diagram of a PVDF-TrFE based pressure sensor fabricated by using the method from FIG. 1, in accordance with a preferred embodiment of the present invention.

With reference now to FIG. 2, there is illustrated a diagram of a PVDF-TrFE based pressure sensor fabricated using the method from FIG. 1, in accordance with a preferred embodiment of the present invention. As shown, a PVDF-TrFE based pressure sensor 20 includes a substrate 21, electrodes 23a, 23b, a PVDF-TrFE fiber 24 having a core 27 and a core shell 28, and an electrode 25. Substrate 21 is formed by substrate 11 from FIG. 1. Electrodes 23a and 23b are formed by first metal layer 13 from FIG. 1. PVDF-TrFE fiber 24 is formed by PVDF-TrFE fiber 14 from FIG. 1. Electrode 25 is formed by second metal layer 15 from FIG. 1.

PVDF-TrFE fiber 24 is capable of sensing the amount of pressure being applied to pressure sensor 20. The number of charges induced within PVDF-TrFE fiber 24 is linearly proportional to the amount of pressure being applied to pressure sensor 20. Electrode 15 is electrically connected to electrode 23a. Electrodes 23a and 23b are connected to a readout circuit capable of reading the number of charges induced within PVDF-TrFE fiber 24.

Figure 3:
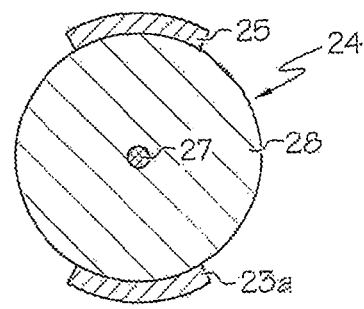
FIG. 3 is a cross-sectional diagram of the PVDF-TrFE based pressure sensor from FIG. 2, in accordance with a preferred embodiment of the present invention.

Referring now to FIG. 3, there is depicted a cross-sectional diagram of PVDF-TrFE based pressure sensor 20 from FIG. 2 along x-x, in accordance with a preferred embodiment of the present invention. As shown, electrodes 23a and 25 are located on the surface of fiber 24. Core 27 is embedded within core shell 28.

As has been described, the present invention provides a method for fabricating PVDF-TrFE based pressure sensors.

While the invention has been particularly shown and described with reference to a preferred embodiment, it will be understood by those skilled in the art that various changes in form and detail may be made therein without departing from the spirit and scope of the invention.

What is claimed is:

1. A pressure sensor comprising:
    a substrate;
    a PVDF fiber having a core and a core shell;
    a first electrode located between said PVDF fiber and said substrate;
    a second electrode located opposite said first electrode with said PVDF fiber located between said first and second electrodes;
    a first terminal connected to said first and second electrodes; and
    a second terminal connected to said core within said PVDF fiber, wherein a number of charges induced within said PVDF fiber caused by any pressure applied to said PVDF fiber is configured to be measured via said first and second terminals.

2. The pressure sensor of claim 1, wherein said number of charges induced within said PVDF fiber is linearly proportional to the amount of pressure being applied to said PVDF fiber.

3. The pressure sensor of claim 1, wherein said substrate is a double silicon-on-insulator substrate.

4. The pressure sensor of claim 1, wherein said substrate is a kapton substrate.

5. A method of fabricating a sensor, said method comprising:
    depositing and patterning a first metal layer on top of a substrate;
    depositing a PVDF nano fiber on top of said substrate, making contact with said first metal layer, wherein said PVDF nano fiber includes a core and a core shell;
    etching said PVDF nano fiber;
    depositing a second metal layer on top of said PVDF nano fiber;
    etching said second metal layer;
    forming a first terminal of said sensor by connecting said first and second metal layers; and
    forming a second terminal of said sensor by utilizing said a core of said PVDF nano fiber.

6. The method of claim 5, wherein said substrate is a double silicon-on-insulator substrate.

7. The method of claim 5, wherein said substrate is includes a kapton substrate.

8. The method of claim 5, wherein said PVDF nano fiber is etched via a reactive ion etch.

9. The method of claim 5, wherein said second metal layer is etched via a reactive ion etch.

10. A method of fabricating a sensor, said method comprising:
    depositing and patterning a first metal layer on top of a substrate;
    depositing a PVDF-TrFE nano fiber on top of said substrate, making contact with said first metal layer, wherein said PVDF-TrFE nano fiber includes a core and a core shell;
    etching said PVDF-TrFE nano fiber;
    depositing a second metal layer on top of said PVDF-TrFE nano fiber;
    etching said second metal layer;
    forming a first terminal of said sensor by connecting said first and second metal layers; and
    forming a second terminal of said sensor by utilizing said core of said PVDF-TrFE nano fiber.

11. The method of claim 10, wherein said substrate is a double silicon-on-insulator substrate.

12. The method of claim 10, wherein said substrate is a kapton substrate.

13. The method of claim 10, wherein said PVDF-TrFE nano fiber is etched via a reactive ion etch.

14. The method of claim 10, wherein said second metal layer is etched via a reactive ion etch.

* * * * *